United States Patent
Hisaka et al.

(10) Patent No.: US 10,388,585 B2
(45) Date of Patent: Aug. 20, 2019

(54) SEMICONDUCTOR DEVICE AND METHOD OF MANUFACTURING THE SAME

(71) Applicant: Mitsubishi Electric Corporation, Tokyo (JP)

(72) Inventors: Takayuki Hisaka, Tokyo (JP); Masahiro Totsuka, Tokyo (JP); Tasuku Sumino, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 15/660,996

(22) Filed: Jul. 27, 2017

(65) Prior Publication Data

US 2018/0122718 A1 May 3, 2018

(30) Foreign Application Priority Data

Oct. 28, 2016 (JP) ................. 2016-211651

(51) Int. Cl.
*H01L 29/778* (2006.01)
*H01L 29/423* (2006.01)
(Continued)

(52) U.S. Cl.
CPC ........ *H01L 23/3192* (2013.01); *H01L 21/022* (2013.01); *H01L 21/0217* (2013.01);
(Continued)

(58) Field of Classification Search
CPC . H01L 23/28; H01L 23/3171; H01L 23/3192; H01L 29/122–127; H01L 29/15–158; H01L 29/42316; H01L 29/6656; H01L 29/66431; H01L 29/66462; H01L 29/6653; H01L 29/66719; H01L 29/778–7789; H01L 29/7816; H01L 29/808; H01L 21/02183; H01L 21/02164; H01L 21/0228; H01L 21/02274; H01L 21/02107; H01L 21/02112; H01L 21/022; H01L 21/02208; H01L 21/02205;
(Continued)

(56) References Cited

U.S. PATENT DOCUMENTS

2002/0115252 A1* 8/2002 Haukka .................. C23C 16/40 438/240
2004/0224529 A1* 11/2004 Totsuka ............ H01L 21/28575 438/767

(Continued)

FOREIGN PATENT DOCUMENTS

JP Hei-5-335345 A 12/1993
JP 2016-103646 A 6/2016

OTHER PUBLICATIONS

Takayuki Hisaka, et al. "Degradation Mechanism of AlGaAs/InGaAs Power Pseudomorphic High-Electron-Mobility Transistors under Large-Signal Operation", Japanese Journal of Applied Physics, vol. 47, No. 2, pp. 833-838, published on Feb. 15, 2008.

*Primary Examiner* — Natalia A Gondarenko
(74) *Attorney, Agent, or Firm* — Studebaker & Brackett PC

(57) ABSTRACT

A semiconductor device includes: a semiconductor substrate; a gate electrode on the semiconductor substrate; a SiN film on the semiconductor substrate and the gate electrode; and an oxide film on the SiN film, wherein the oxide film is an atomic layer deposition film including atomic layers alternately deposited.

8 Claims, 4 Drawing Sheets

(51) Int. Cl.
*H01L 29/06* (2006.01)
*H01L 29/66* (2006.01)
*H01L 23/28* (2006.01)
*H01L 23/31* (2006.01)
*H01L 21/02* (2006.01)
*H01L 29/808* (2006.01)
*H01L 29/812* (2006.01)
*H01L 21/8252* (2006.01)
*H01L 23/29* (2006.01)

(52) U.S. Cl.
CPC .... *H01L 21/0228* (2013.01); *H01L 21/02183* (2013.01); *H01L 21/02274* (2013.01); *H01L 21/02301* (2013.01); *H01L 29/42316* (2013.01); *H01L 29/778* (2013.01); *H01L 29/808* (2013.01); *H01L 29/812* (2013.01); *H01L 23/291* (2013.01)

(58) Field of Classification Search
CPC ........... H01L 21/02225; H01L 21/0229; H01L 21/2123; H01L 21/0217; H01L 21/28114; H01L 21/823468; H01L 21/823456; H01L 21/82385; H01L 2924/13064; H01L 29/812; H01L 23/291; H01L 21/02301; H01L 21/823864
USPC ......... 257/194, 256, 288, E29.246, E29.255, 257/E29.312, 76, E29.317, E29.111, 257/E21.04, E21.403; 438/172, 197, 706
See application file for complete search history.

(56) References Cited

U.S. PATENT DOCUMENTS

| | | | |
|---|---|---|---|
| 2009/0140262 A1* | 6/2009 | Ohki | H01L 23/291 257/76 |
| 2009/0189205 A1* | 7/2009 | Ohki | H01L 29/66462 257/288 |
| 2014/0097469 A1* | 4/2014 | Hagleitner | H01L 23/291 257/194 |
| 2014/0284661 A1* | 9/2014 | Williams | H01L 21/8252 257/192 |

* cited by examiner

SEMICONDUCTOR DEVICE AND METHOD OF MANUFACTURING THE SAME

BACKGROUND OF THE INVENTION

Field

The present invention relates to a semiconductor device and a method of manufacturing the same

Background

In conventional semiconductor devices, a SiN film is generally used as a protective film for protecting a gate electrode (see, for example, Japanese Patent Application Publication No. H5-335345). Further, an oxide film formed by the ALD (Atomic Layer Deposition) process is also used (see, for example, Japanese Patent Application Publication No, 2016-103646).

Non-hermetic packages, which are inexpensive, have started being used to reduce costs. This requires that semiconductor devices themselves have moisture resistance. However, if a conventional semiconductor device is used in a non-hermetic package, there is a problem that moisture intrudes into the package to deteriorate a semiconductor around a gate electrode (see, for example, Takayuki Hisaka, et al., "Degradation Mechanism of AlGaAs/InGaAs Power Pseudomorphic High-Electron-Mobility Transistors under Large-Signal Operation," Japanese Journal of Applied Physics, Vol. 47, No. 2, 2008, pp. 833-838). In particular, a SiO or SiN film formed by plasma-enhanced chemical vapor deposition (PECVD) does not have coverage good enough for level differences or overhangs of a T-shaped gate electrode or a recessed structure employed in a high frequency transistor, and it is difficult to prevent the intrusion of moisture with such a film. If the thickness of a SiN film is increased to improve moisture resistance, there is a problem that an increase in capacitance is caused to deteriorate high-frequency characteristics.

If the ALD process is used, one atomic layer is deposited at a time, and denseness is provided, thus achieving improved coverage. However, in the case where an ALD film is used as a protective film, moisture resistance cannot be improved. This seems to be because moisture intrudes into the interface between a semiconductor and the protective film to deteriorate the semiconductor.

SUMMARY

The present invention has been accomplished to solve the above-described problems, and an object of the present invention is to provide a semiconductor device having moisture resistance improved by increasing the thickness of a protective film and a method of manufacturing the same.

According to the present invention, a semiconductor device includes: a semiconductor substrate; a gate electrode on the semiconductor substrate; a SiN film on the semiconductor substrate and the gate electrode; and an oxide film on the SiN film, wherein the oxide film is an atomic layer deposition film including atomic layers alternately deposited.

In the present invention, the SiN film, which forms a good interface with the semiconductor substrate, is formed, and an atomic layer deposition film, which has good coverage, is formed on the SiN film. This can reduce the deterioration of the surface of the semiconductor substrate caused by the intrusion of moisture. Accordingly, moisture resistance can be improved without increasing the thickness of a protective film.

Other and further objects, features and advantages of the invention will appear more fully from the following description.

DESCRIPTION OF EMBODIMENTS

A semiconductor device and a method of manufacturing the same according to the embodiments of the present invention will be described with reference to the drawings. The same components will be denoted by the same symbols, and the repeated description thereof may be omitted.

Embodiment 1

Figure 1:
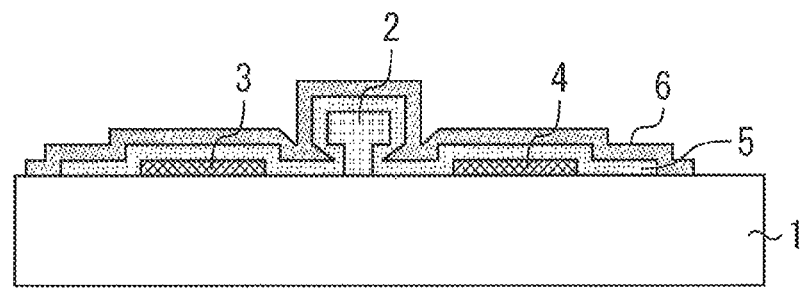
FIG. 1 is a cross-sectional view showing a semiconductor device according to Embodiment 1 of the present invention.

FIG. 1 is a cross-sectional view showing a semiconductor device according to Embodiment 1 of the present invention. This semiconductor device is a field effect transistor such as a MES-FET or a HEMT.

A T-shaped gate electrode 2, a source electrode 3, and a drain electrode 4 are formed on a semiconductor substrate 1 made of GaAs or the like. A SiN film 5 is formed on the semiconductor substrate 1, the gate electrode 2, and the like. The SiN film 5 is formed by PECVD as follows: atoms merge into cores, the cores merge into island clusters, and the island clusters merge into a continuous film. The SiN film 5 directly contacts the semiconductor substrate 1, thus forming an interface therebetween.

A $Ta_2O_5$ film 6 is formed on the SiN film 5. The $Ta_2O_5$ film 6 is an ALD film formed by alternately depositing atomic layers by the ALD (Atomic Layer Deposition) process. Instead of the $Ta_2O_5$ film 6, $ZrO_2$, $HfO$, $Al_2O_3$, or $SiO_2$ may the used, or $Ta_2O_5$ films and $SiO_2$ films may be alternately deposited.

Figure 2:
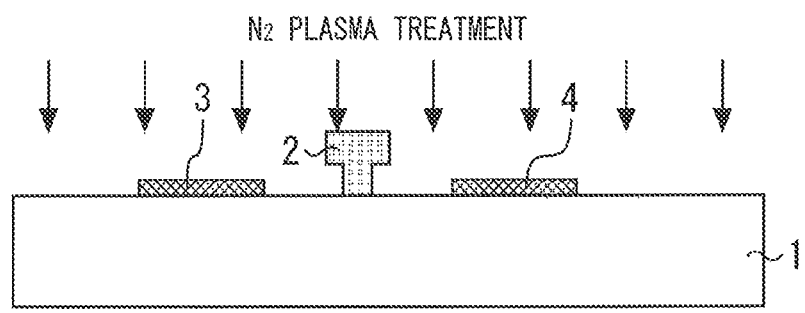
FIGS. 2 and 3 are cross-sectional views showing fabrication steps of the semiconductor device according to Embodiment 1 of the present invention.
Figure 3:
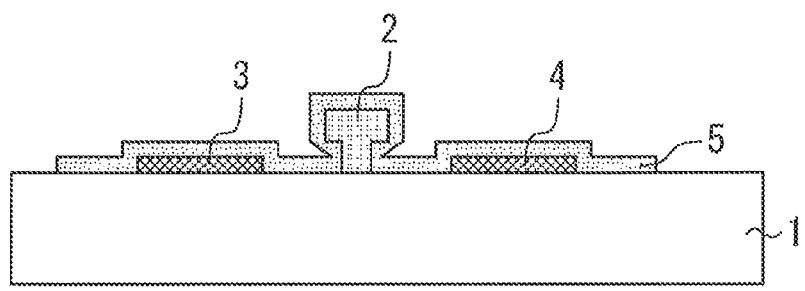

FIGS. 2 and 3 are cross-sectional views showing fabrication steps of the semiconductor device according to Embodiment 1 of the present invention. First, as shown in FIG. 2, the gate electrode 2, the source electrode 3, and the drain electrode 4 are formed on the semiconductor substrate 1. An oxidized semiconductor film and residues of organic matter produced in the process step are attached to the surface of the semiconductor substrate 1 after this process step. Accordingly, residues of organic matter and oxygen on the surface of the semiconductor substrate 1 are removed by N$_2$ plasma treatment in a PECVD apparatus.

Then, as shown in FIG. 3, the SiN film 5 is formed on the gate electrode 2 by PECVD in the PECVD apparatus immediately after the N$_2$ plasma treatment. Subsequently, the Ta$_2$O$_5$ film 6 is formed on the SiN film 5 by the ALD process. Thus, the semiconductor device shown in FIG. 1 is manufactured.

Figure 4:
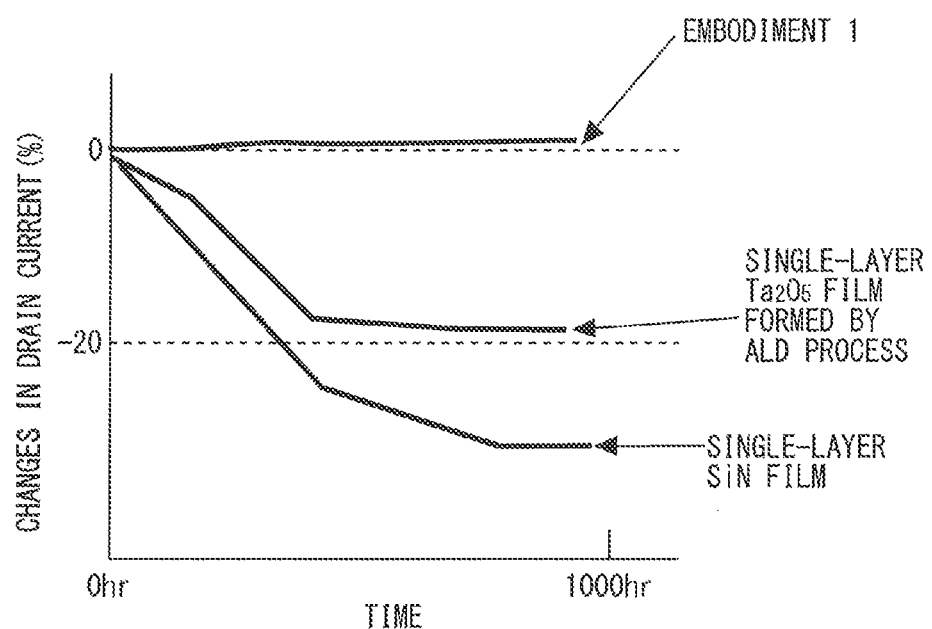
FIG. 4 is a view showing changes in the drain current during biased moisture resistance testing.

FIG. 4 is a view showing changes in the drain current during biased moisture resistance testing. In the case where the protective film for the gate electrode is a single-layer SiN film formed by PECVD or a single-layer Ta$_2$O$_5$ film formed by the ALD process, the drain current decreases. On the other hand, this Embodiment 1 does not show a decrease in the drain current after 1000 hrs.

As described above, in this embodiment, the SiN film 5, which forms a good interface with the semiconductor substrate 1, is formed, and an ALD film, which has good coverage, is formed on the SiN film 5. This can reduce the deterioration of the surface of the semiconductor substrate 1 caused by the intrusion of moisture. Accordingly, moisture resistance can be improved without increasing the thickness of a protective film.

Moreover, the SiN film 5 is formed on the gate electrode 2 by PECVD immediately after residues of organic matter and oxygen on the surface of the semiconductor substrate 1 are removed by N$_2$ plasma treatment. Thus, oxygen at the interface between the semiconductor substrate 1 and the SiN film 5 is greatly reduced compared to those in the case where N$_2$ plasma treatment is not performed. Accordingly, an oxidation reaction of the semiconductor substrate 1 is reduced. Forming the ALD film having good coverage on the SiN film 5 can improve moisture resistance without increasing the thickness of a protective film.

Embodiment 2

Figure 5:
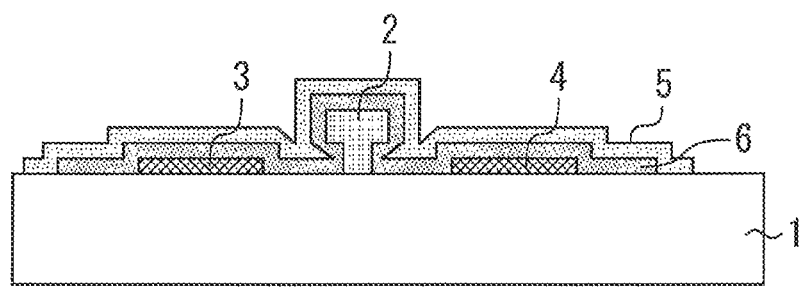
FIG. 5 is a cross-sectional view showing a semiconductor device according to Embodiment 2 of the present invention.

FIG. 5 is a cross-sectional view showing a semiconductor device according to Embodiment 2 of the present invention. In this embodiment, the Ta$_2$O$_5$ film 6 is formed on the semiconductor substrate 1, the gate electrode 2, and the like by the ALD process. An unnecessary portion of the Ta$_2$O$_5$ film 6 is etched and removed by a transfer step and an etching step. The semiconductor substrate 1 is treated with N$_2$ plasma, and immediately the SiN film 5 is formed on the entire surfaces of the semiconductor substrate 1 and the Ta$_2$O$_5$ film 6 by PECVD. The SiN film 5 directly contacts the semiconductor substrate 1, thus forming an interface therebetween. Except for the above-described points, the configuration of the semiconductor device of this embodiment is the same as that of Embodiment 1.

The Ta$_2$O$_5$ film 6, which is an ALD film, is dense and has good coverage. Accordingly, the Ta$_2$O$_5$ film 6 can reduce the intrusion of moisture from the surfaces of the overhangs of the gate electrode 2. Moreover, forming the SiN film 5 immediately after N$_2$ plasma treatment can reduce the deterioration of the interface between GaAs and SiN films. Thus, the intrusion of moisture along the interface between a peripheral portion of the Ta$_2$O$_5$ film 6 and the semiconductor substrate 1 can be reduced. As a result, moisture resistance can be improved without increasing the thickness of a protective film.

Embodiment 3

Figure 6:
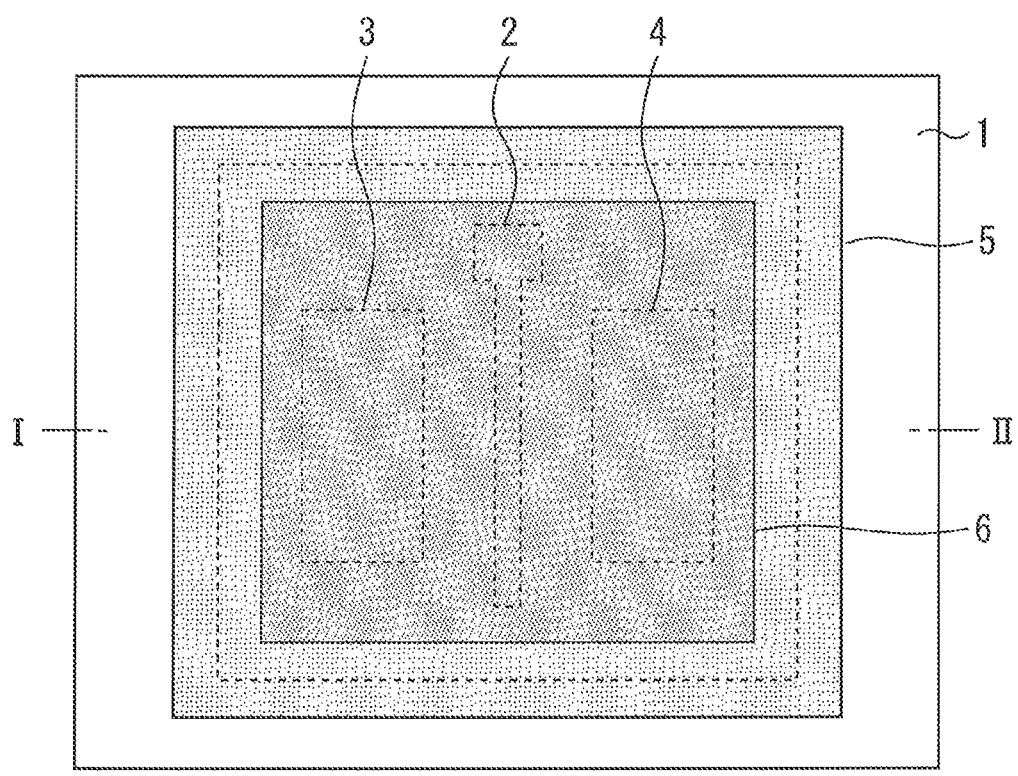
FIG. 6 is a plan view showing a semiconductor device according to Embodiment 3 of the present invention.
Figure 7:
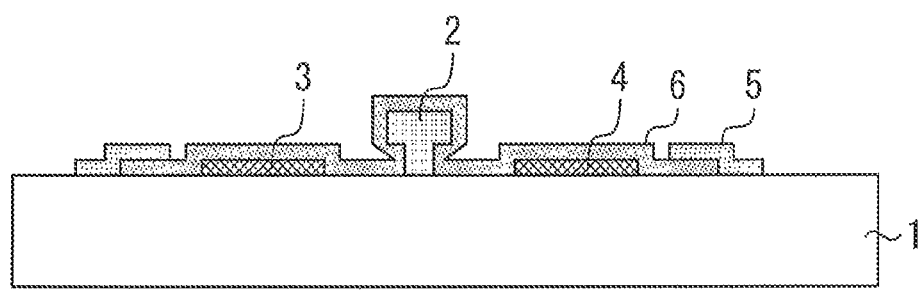
FIG. 7 is a cross-sectional view taken along line I-II in FIG. 6.

FIG. 6 is a plan view showing a semiconductor device according to Embodiment 3 of the present invention. FIG. 7 is a cross-sectional view taken along line I-II in FIG. 6. In this embodiment, an unnecessary portion of the SiN film 5 is etched and removed by a transfer step and an etching step so that only a portion corresponding to a peripheral portion of the Ta$_2$O$_5$ film 6 may be left. Using dry etching makes it possible to selectively remove only the SiN film 5 while leaving the Ta$_2$O$_5$ film 6 on the gate electrode 2. Except for the above-described points, the configuration of the semiconductor device of this embodiment is the same as that of Embodiment 2.

Thus, effects similar to those of Embodiment 2 can be obtained. Specifically, forming the SiN film 5 on the semiconductor substrate 1 and at least a peripheral portion of the Ta$_2$O$_5$ film 6 can reduce the intrusion of moisture along the interface between the peripheral portion of the Ta$_2$O$_5$ film 6 and the semiconductor substrate 1. Moreover, removing the unnecessary portion of the SiN film 5 around the gate electrode 2 can reduce an increase in the gate capacitance. As a result, a semiconductor device having high moisture resistance and good high-frequency performance can be realized.

Embodiment 4

Figure 8:
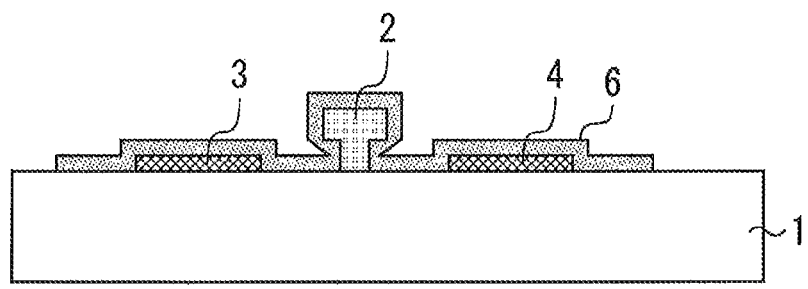
FIG. 8 is a cross-sectional view showing a semiconductor device according to Embodiment 4 of the present invention.

FIG. 8 is a cross-sectional view showing a semiconductor device according to Embodiment 4 of the present invention. While Embodiments 1 to 3 use an oxide film made of Ta$_2$O$_5$ or the like, this embodiment uses only a SiN film 7 formed by the ALD process as a protective film.

Next, a method of manufacturing the semiconductor device according to this embodiment will be described. First, the gate electrode 2, the source electrode 3, and the drain electrode 4 are formed on the semiconductor substrate 1. Then, the semiconductor substrate 1 is treated with N$_2$ plasma, and immediately the SiN film 7 is formed on the semiconductor substrate 1, the gate electrode 2, and the like by the ALD process. Specifically, NH$_3$ is excited in a plasma source to be supplied, and Si layer formation and nitriding treatment are performed at a low temperature of approximately 400° C. layer by layer, thus depositing a SiN film. Instead of the SiN film 7, other nitride film made of AlN or the like may be formed.

Oxygen on the surface of the semiconductor substrate 1 is effectively removed by N$_2$ plasma treatment, and after that the SiN film 7 is immediately formed by the ALD process in the same apparatus. This can reduce oxygen at the interface between the semiconductor substrate 1 and the SiN film 7, and can reduce the intrusion of moisture along the interface. Moreover, the ALD process produces a film having good coverage despite level differences or overhanging shapes of the T-shaped gate electrode 2 or the like. As a result, moisture resistance can be improved without increasing the thickness of a protective film.

Embodiment 5

Figure 9:
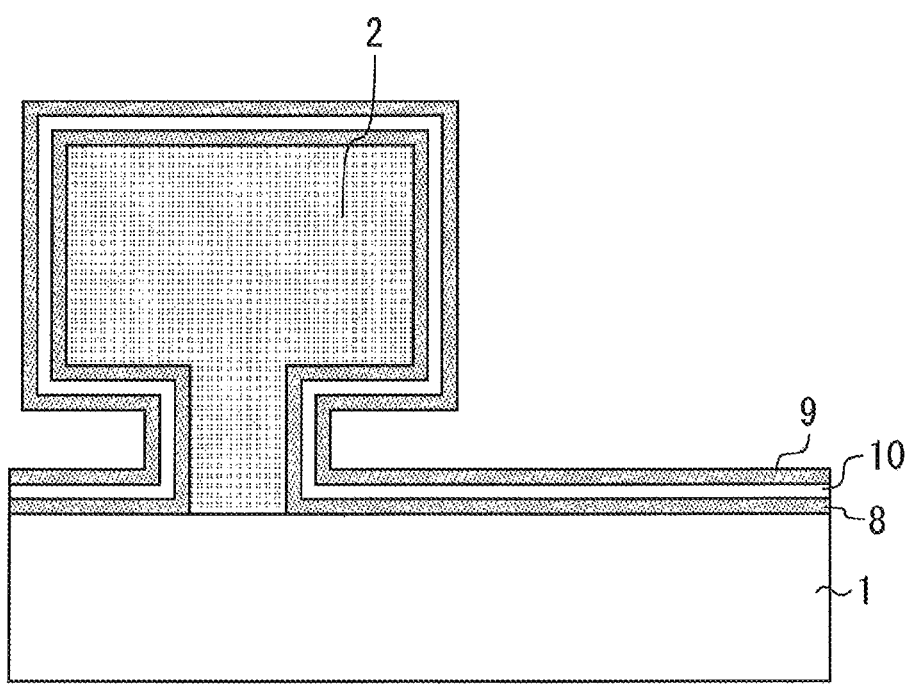
FIG. 9 is a cross-sectional view showing a gate electrode of a semiconductor device according to Embodiment 5 of the present invention and surroundings.

FIG. 9 is a cross-sectional view showing a gate electrode of a semiconductor device according to Embodiment 5 of the present invention and surroundings. The gate electrode 2 is covered with a laminated film including TaO films 8 and 9 and a SiO film 10 interposed therebetween which has a permittivity lower than those of the Tad films 8 and 9. These layers are formed by the ALD process. While a three-layer structure is shown here as an example, a multilayer film including more than three layers may be employed. Except for the above-described points, the configuration of the semiconductor device of this embodiment is the same as those of Embodiments 1 to 3.

Inserting the SiO film 10 having a low permittivity can achieve a permittivity lower than that of a single-layer $Ta_2O_5$ film. In particular, a film between a lower portion of the gate electrode 2 and the semiconductor substrate 1 strongly influences the gate capacitance. Accordingly, inserting the SiO film 10 can reduce the gate capacitance, and can reduce the degradation of high-frequency performance.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2016-211651, filed on Oct. 28, 2016 including specification, claims, drawings and summary, on which the Convention priority of the present application is based, is incorporated herein by reference in its entirety.

The invention claimed is:

1. A semiconductor device comprising:
a semiconductor substrate;
a source electrode and drain electrode on the semiconductor substrate;
a gate electrode on the semiconductor substrate;
a SiN film on the semiconductor substrate and the gate electrode; and
a TaO film on the SiN film, wherein
the TaO film is an atomic layer deposition film including atomic layers alternately deposited, and
the TaO film is directly on the semiconductor substrate only adjacent to sides of the source and drain electrodes that do not face the gate electrode.

2. The semiconductor device according to claim 1, wherein the TaO film is a laminated film including first and second TaO films and a film interposed between the first and second TaO films and having a permittivity lower than permittivities of the first and second TaO films.

3. A semiconductor device comprising:
a semiconductor substrate;
a source electrode and drain electrode on the semiconductor substrate;
a gate electrode on the semiconductor substrate, the gate electrode having an upper portion overhanging a lower portion narrower than the upper portion;
a SiN film on the semiconductor substrate and the gate electrode; and
a TaO film on the SiN film, wherein
the TaO film is an atomic layer deposition film including atomic layers alternately deposited,
portions of the SiN film and the TaO film extend over the gate electrode and underneath the overhanging upper portion of the gate electrode, and
the TaO film is directly on the semiconductor substrate only adjacent to sides of the source and drain electrodes that do not face the gate electrode.

4. A semiconductor device comprising:
a semiconductor substrate;
a source electrode and drain electrode on the semiconductor substrate;
a gate electrode on the semiconductor substrate;
a SiN film on the semiconductor substrate and the gate electrode; and
an oxide film on the SiN film, wherein
the oxide film is an atomic layer deposition film including atomic layers alternately deposited,
the SiN film is directly on the semiconductor substrate adjacent to sides of the source and drain electrodes that do not face the gate electrode, and
the oxide film is directly on the semiconductor substrate only adjacent to sides of the source and drain electrodes that do not face the gate electrode.

5. The semiconductor device according to claim 4, wherein the oxide film is a laminated film including first and second TaO films and a film interposed between the first and second TaO films and having a permittivity lower than permittivities of the first and second TaO films.

6. A semiconductor device comprising:
a semiconductor substrate;
a source electrode and drain electrode on the semiconductor substrate;
a gate electrode on the semiconductor substrate, the gate electrode having an upper portion overhanging a lower portion narrower than the upper portion;
a SiN film on the semiconductor substrate and the gate electrode; and
an oxide film on the SiN film, wherein
the oxide film is an atomic layer deposition film including atomic layers alternately deposited,
portions of the SiN film and the oxide film extend over the gate electrode and underneath the overhanging upper portion of the gate electrode,
the SiN film is directly on the semiconductor substrate, and
the oxide film is directly on the semiconductor substrate only adjacent to sides of the source and drain electrodes that do not face the gate electrode.

7. The semiconductor device according to claim 4, wherein the oxide film is a TaO film.

8. The semiconductor device according to claim 6, wherein the oxide film is a TaO film.

* * * * *